United States Patent [19]

Sei et al.

[11] Patent Number: 5,272,366

[45] Date of Patent: Dec. 21, 1993

[54] BIPOLAR TRANSISTOR/INSULATED GATE TRANSISTOR HYBRID SEMICONDUCTOR DEVICE

[75] Inventors: Toshikazu Sei, Kawasaki; Yasunori Tanaka, Yokohama; Hiroyuki Hara, Fujisawa, all of Japan

[73] Assignee: Kabushiki Kaisha Toshiba, Kawasaki, Japan

[21] Appl. No.: 747,864

[22] Filed: Aug. 20, 1991

[30] Foreign Application Priority Data

Aug. 22, 1990 [JP] Japan .................. 2-222256

[51] Int. Cl.⁵ .................. H01L 27/10; H01L 29/76
[52] U.S. Cl. .................. 257/206; 257/204; 257/370; 257/378; 257/379
[58] Field of Search .................. 257/202, 204, 205, 206, 257/370, 369, 379, 378, 577, 565

[56] References Cited

U.S. PATENT DOCUMENTS

| | | | |
|---|---|---|---|
| 4,661,815 | 4/1987 | Takayama et al. | 257/204 |
| 4,675,561 | 6/1987 | Bowers | 257/378 |
| 4,682,202 | 7/1987 | Tanizawa | 257/378 |
| 5,066,996 | 11/1991 | Hara et al. | 257/205 |
| 5,072,285 | 12/1991 | Ueda et al. | 257/206 |
| 5,107,147 | 4/1992 | Yee et al. | 257/370 |

*Primary Examiner*—William Mintel
*Assistant Examiner*—Steven Loke
*Attorney, Agent, or Firm*—Finnegan, Henderson, Farabow, Garrett & Dunner

[57] ABSTRACT

A bipolar transistor/insulated gate transistor hybrid semiconductor device comprises a well region formed on a semiconductor substrate to serve as a first active region of a bipolar transistor, an insulated gate transistor having source and drain regions formed in the well region, which acts as a back gate of the insulated gate transistor, and second and third active regions of the bipolar transistor formed in the well region. At least one of the second and third active regions is used in common to one of the source and drain regions of the insulated gate transistor. A plurality of well regions is regularly arranged to constitute a gate array.

13 Claims, 11 Drawing Sheets

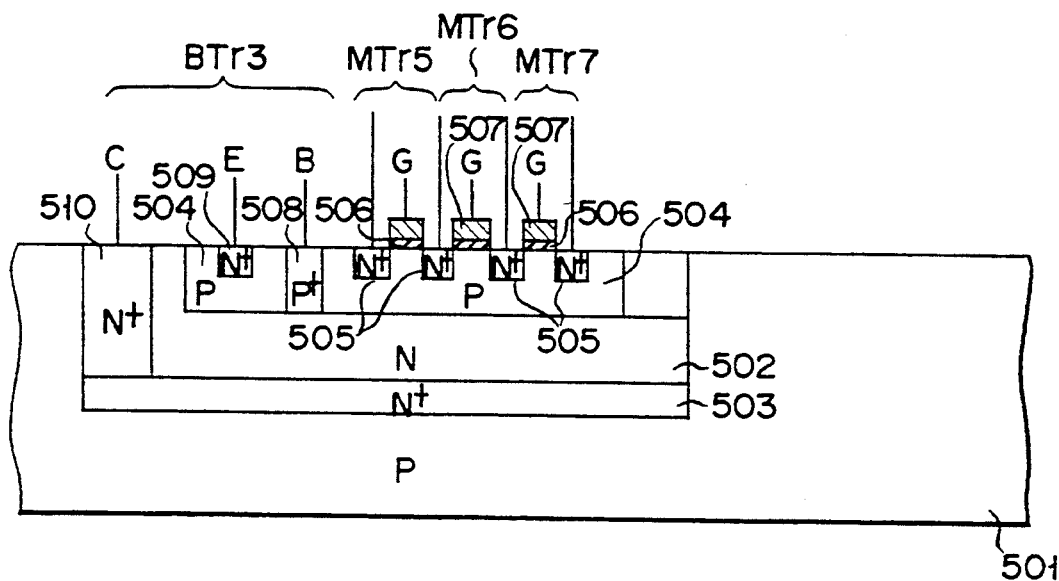
F I G. 5
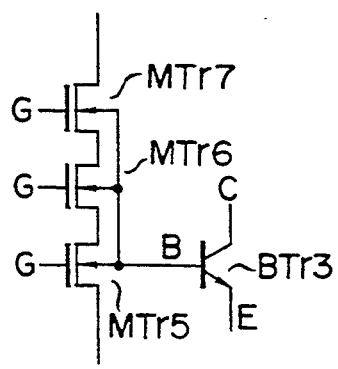
F I G. 6

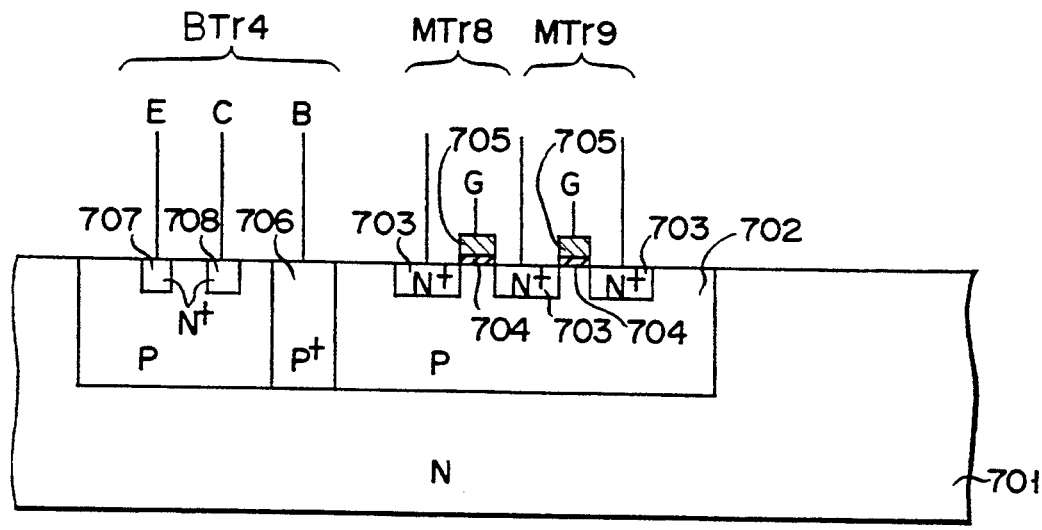
F I G. 7
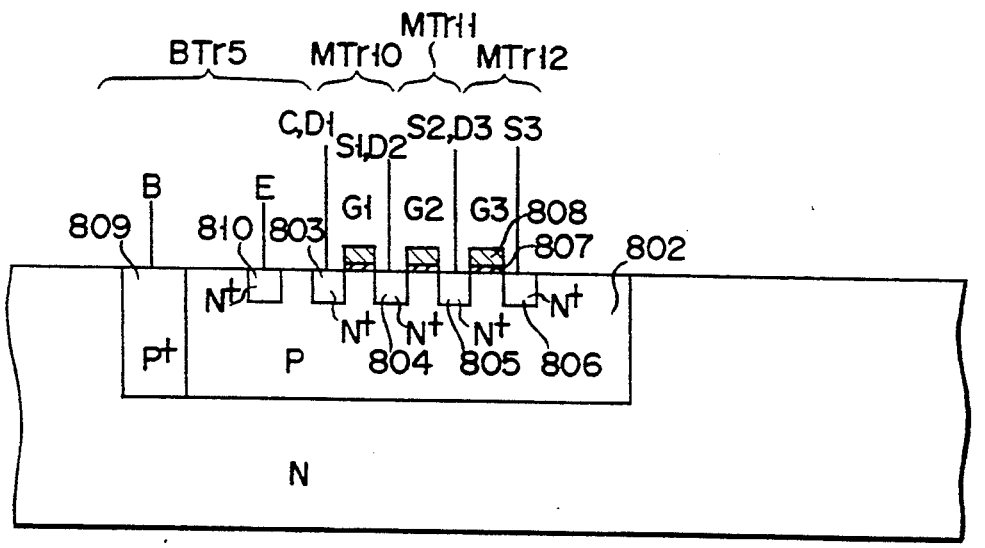
F I G. 8

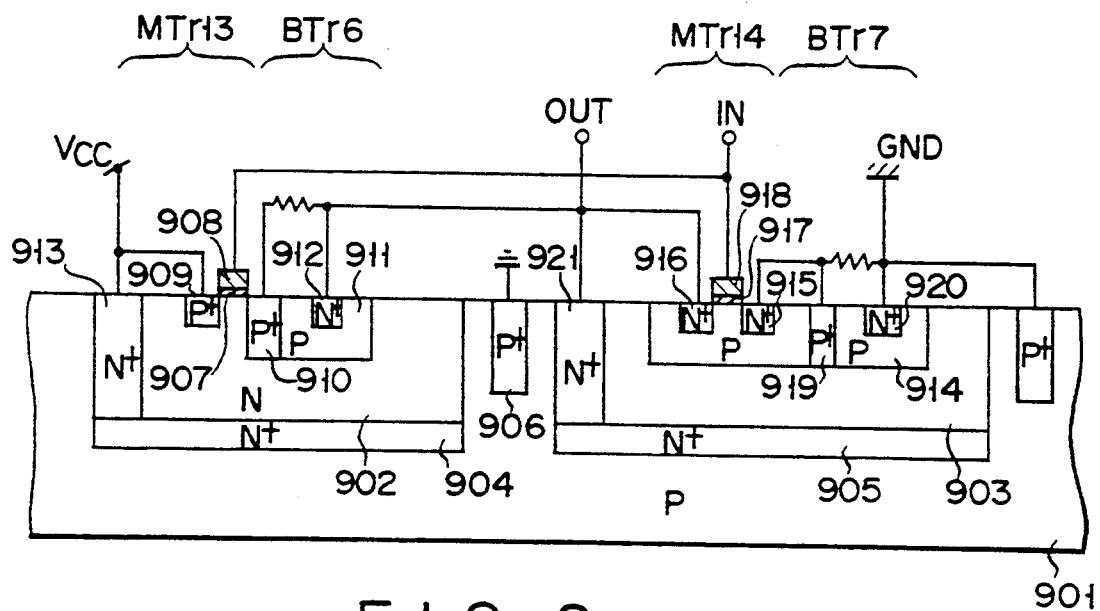
F I G. 9
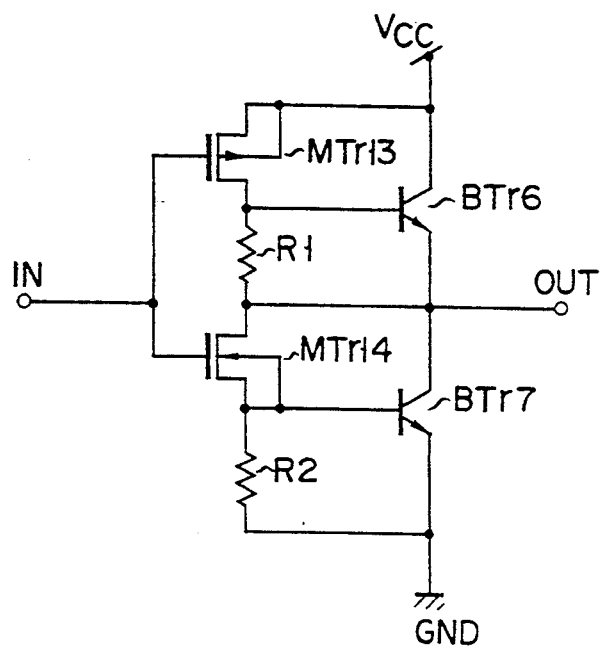
F I G. 10

BIPOLAR TRANSISTOR/INSULATED GATE TRANSISTOR HYBRID SEMICONDUCTOR DEVICE

BACKGROUND OF THE INVENTION

1. Field of the Invention

The present invention relates to a bipolar transistor/insulated gate transistor hybrid semiconductor device which is reduced in size to constitute a Bi-MOS IC or the like.

2. Description of the Related Art

A Bi-MOS IC is known as a bipolar transistor/insulated gate transistor hybrid semiconductor device. In the Bi-MOS IC, both a bipolar element capable of high-speed operation at high frequency and a MOS element adaptable for digital processing and capable of high degree of integration are mounted on the same chip. Various types of circuits can be attained by taking advantage of these elements.

Conventionally, the bipolar element and MOS element are separately formed on their respective diffusion regions on the semiconductor substrate, and a separation region is formed between the diffusion regions. For example, a bias is suitably applied to a first diffusion region on which a bipolar element is formed, a second diffusion region on which a MOS element is formed, and a separation region therebetween so that the regions are connected to each other in a reverse bias state. Since, however, a bias for separating the first and second diffusion regions is applied, a number of wiring layers connecting the separation region and diffusion regions are needed, which prevents a chip from reducing in area.

Assume that a gate array (master slice) including a bipolar element and a MOS element is formed. Actually, the bipolar element and MOS element are hardly used at the same time. Therefore, in the conventional arrangement wherein the bipolar element and MOS element are separately formed in their respective diffusion regions, a degree of use for the elements is remarkably lowered and accordingly a degree of integration is prevented from being enhanced.

SUMMARY OF THE INVENTION

It is accordingly an object of the present invention to provide a bipolar transistor/gate insulated transistor hybrid semiconductor device which is reduced in chip area.

To attain the above object, there is provided a bipolar transistor/insulated gate transistor hybrid semiconductor device, comprising:

a well region formed on a semiconductor substrate to serve as a first active region of a bipolar transistor;

an insulated gate transistor having source and drain regions formed in the well region, the well region acting as a back gate of the insulated gate transistor; and second and third active regions of the bipolar transistor, formed in the well region.

With the above arrangement, the back gate of the insulated gate transistor is used in common to a diffusion layer of the bipolar transistor, and the insulated gate transistor is formed on part of the diffusion layer of the bipolar transistor. Since the formation pattern of a gate array is geometrically symmetrical, the efficiency of use for gates is improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a cross-sectional view showing a hybrid semiconductor device according to a third embodiment of the present invention;

FIG. 6 is a circuit diagram showing an equivalent circuit for the device shown in FIG. 5;

FIG. 7 is a cross-sectional view showing a hybrid semicondutor device according to a fourth embodiment of the present invention;

FIG. 8 is a cross-sectional view showing a hybrid semiconductor device according to a fifth embodiment of the present invention;

FIG. 9 is a cross-sectional view showing a hybrid semiconductor device according to a sixth embodiment of the present invention;

FIG. 10 is a circuit diagram showing an equivalent circuit for the device shown in FIG. 9;

DETAILED DESCRIPTION OF THE PREFERRED EMBODIMENTS

Embodiments of the present invention will be described with reference to the accompanying drawings.

Figure 1:
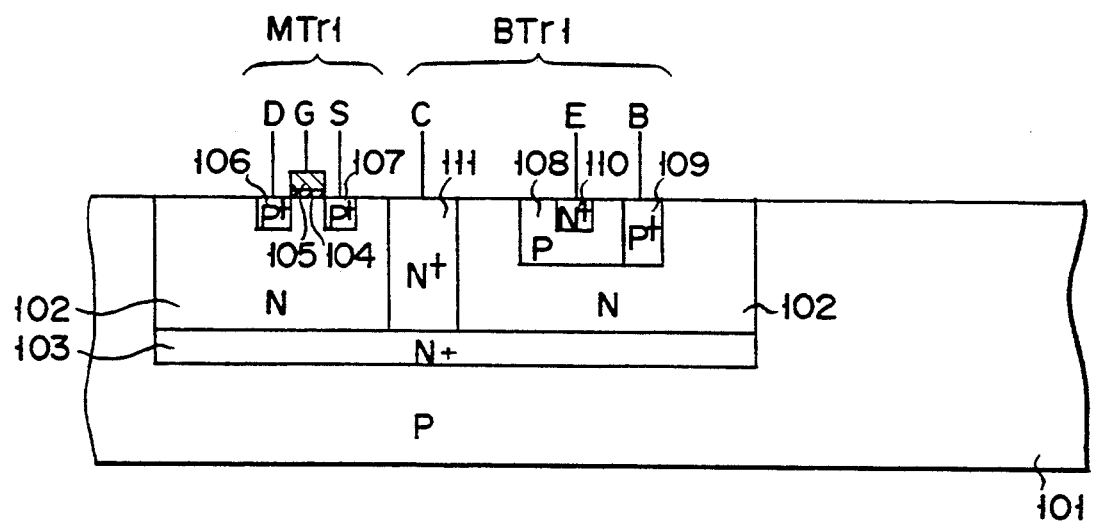
FIG. 1 is a cross-sectional view showing a hybrid semicondutor device according to a first embodiment of the present invention.
Figure 2:
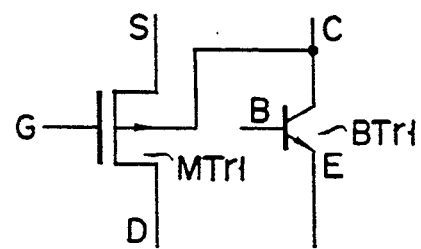
FIG. 2 is a circuit diagram showing an equivalent circuit for the device shown in FIG. 1.

FIG. 1 is a cross-sectional view showing a hybrid semiconductor device according to a first embodiment of the present invention, and FIG. 2 is a circuit diagram showing an equivalent circuit for the device shown in FIG. 1.

Referring to FIG. 1, an N-type diffusion region 102 is formed on a P-type semiconductor substrate 101. An N+-type buried diffusion layer 103 doped with high-concentration N-type impurities is formed on the underside of the diffusion region 102. A P-channel insulated gate transistor MTr1 and an NPN bipolar transistor BTr1 are formed in the diffusion layer 102.

The insulated gate transistor MTr1 has the following configuration. An insulating film 104 is formed on the diffusion region 102 and a gate electrode 105 is formed thereon. P+-type regions 106 and 107, which serve as drain and source regions, respectively, are formed in the surface portion of the diffusion region 102 with the gate electrode 105 interposed therebetween.

The bipolar transistor BTr1 has the following configuration. A P-type region 108 serving as a base, and a P+-type region 109 connected to a base terminal are formed in the N-type diffusion region 102 serving as a collector. An N+-type region 110 serving as an emitter is formed in the P-type region 108. A collector terminal is connected to an N+-type region 111 formed in the diffusion region 102. The diffusion region 102 serves as both the collector of transistor BTr1 and the back gate of transistor MTr1, as apparent from the equivalent circuit shown in FIG. 2. The terminals denoted by alphabets D, G, S, B, E, and C in FIG. 2 correspond to those denoted by the same alphabets in FIG. 1.

Figure 3:
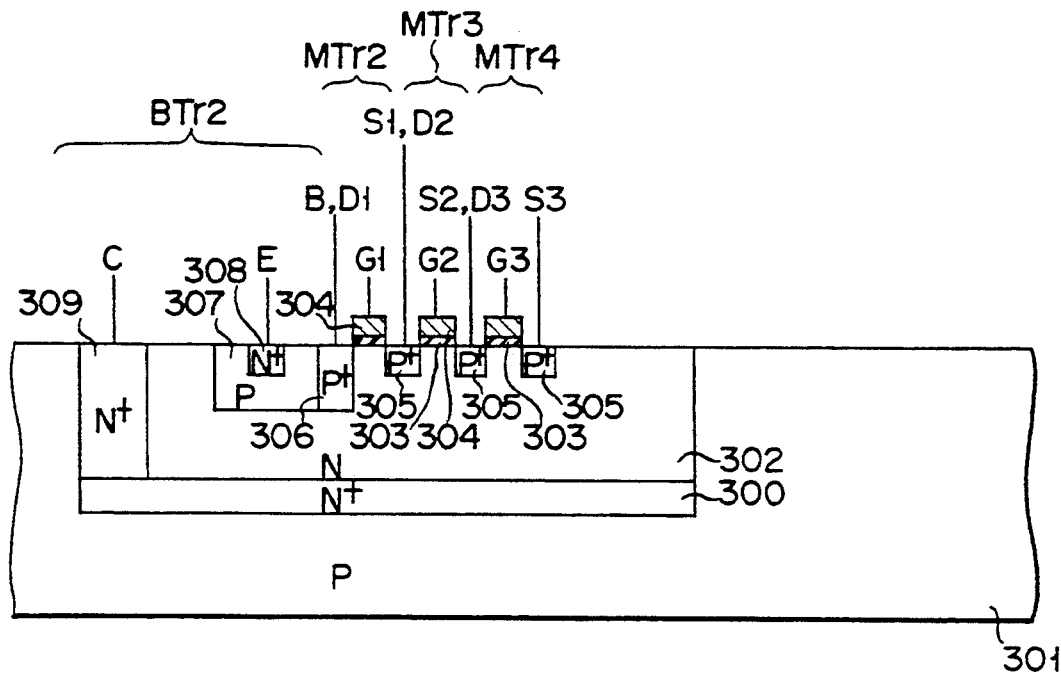
FIG. 3 is a cross-sectional view showing a hybrid semiconductor device according to a second embodiment of the present invention.

FIG. 3 is a cross-sectional view showing a hybrid semiconductor device according to a second embodiment of the present invention, which is an applied example of the device shown in FIG. 1. In the device shown in FIG. 3, three insulated gate transistors are formed, and the base of a bipolar transistor is connected to the drain of one of the three insulated gate transistors.

Figure 4:
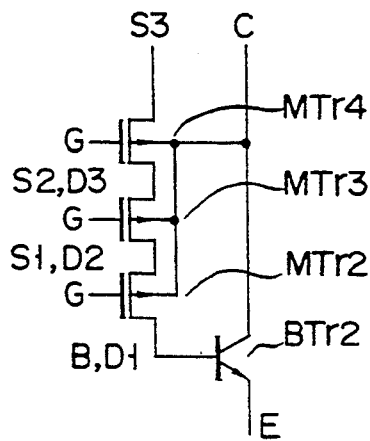
FIG. 4 is a circuit diagram showing an equivalent circuit for the device shown in FIG. 3.

As shown in FIG. 3, an N-type diffusion region 302 is formed in a P-type semiconductor substrate 301, and an N+-type buried diffusion layer 300 is formed on the underside of the diffusion region 302. P-channel insulated gate transistors MTr2 to MTr4 and NPN bipolar transistor BTr2 are formed in the diffusion region 302. The diffusion region 302 serves as a collector of the transistor BTr2 and also serves as back gates of the transistors MTr2 to MTr4, as in the first embodiment. P+-type regions 305 are formed in the surface portion of the diffusion region 302 with an insulating film 303 and gate electrode 304 located between adjacent two of them. Two of the regions 305, which are formed between transistors MTr2 and MTr3 and between MTr3 and MTr4, are each used as both source and drain regions. A P+-type region 306 is formed between the transistors BTr2 and MTr2 to serve as both base and drain regions. In the transistor BTr2, an N+-type region 308 serving as an emitter is formed in a P-type region 307 serving as a base region. An N+-type region 309 connected to a collector terminal is formed in the diffusion region 302. This configuration is represented by an equivalent circuit as shown in FIG. 4 and reduces an element forming area.

FIG. 5 is a cross-sectional view showing a hybrid semiconductor device according to a third embodiment of the present invention. As shown in FIG. 5, an N-type diffusion region 502 and an N+-type buried diffusion layer 503 are formed in a P-type semiconductor substrate 501. A P-type region 504 is formed in the diffusion region 502 to serve as a base of an NPN bipolar transistor BTr3. N-channel insulated gate transistors MTr5 to MTr7 are formed in a P-type region 504. Insulating films 506 are formed on the P-type region 504 so that they can be located between adjacent N+-type regions 505 serving as both source and drain regions, and gate electrodes 507 are formed on the insulating films 506. In the transistor BTr3, a P-type region 508 connected to a base terminal and an N+-type region 509 serving as an emitter are formed in the P-type region 504 serving as a base of the transistor BTr3, and an N+-type region 510 connected to a collector terminal is formed in the diffusion region 502. FIG. 6 shows an equivalent circuit for the device having the above configuration.

FIG. 7 is a cross-sectional view showing a hybrid semiconductor device according to a fourth embodiment of the present invention, which is an applied example of the device shown in FIG. 5. As shown in FIG. 7, a P-type diffusion region 702 is formed in an N-type semiconductor substrate 701 to serve as a base diffusion region of an NPN bipolar transistor BTr4 having a lateral structure. N-channel insulated gate transistors MTr8 and MTr9 are formed in the P-type diffusion region 702. Insulating films 704 are formed on diffusion region 702 so that they can be located between adjacent N+-type regions 703 serving as source and drain regions, and gate electrodes 705 are formed on the insulating films 704. In the bipolar transistor BTr4, a P+-type region 706 connected to a base terminal, and N+-type regions 707 and 708, which serve as a collector and an emitter, respectively, are laterally formed in the P-type region 702 serving as a base of the transistor BTr4.

FIG. 8 is a cross-sectional view showing a hybrid semiconductor device according to a fifth embodiment of the present invention, which is an applied example of the device shown in FIG. 7. The device according to the fifth embodiment is so constructed that the collector or emitter of a bipolar transistor serves as the source or drain of an insulated gate transistor. This construction is favorable if it is unnecessary to separate the transistors from each other in the process of manufacturing the device. As shown in FIG. 8, a P-type diffusion region 802 is formed in an N-type semiconductor substrate 801 to serve as a base diffusion region of an NPN bipolar transistor BTr5 having a lateral structure. N-channel insulated gate transistors MTr10 to MTr12 are formed in the P-type diffusion region 802. Insulating films 807 are formed on the diffusion region 802 so that they can be located between adjacent two if N+-type regions 803 to 806 serving as source and drain regions, and gate electrodes 808 are formed on the insulating films 807. In a transistor BTr5, a P+-type region 809 connected to a base terminal and an N+-type region 810 serving as an emitter are formed in the P-type region 802, and the collector of the transistor BTr5 is used in common to the N+-type region 803 serving as the drain of the transistor MTr10.

FIG. 9 is a cross-sectional view showing a hybrid semiconductor device according to a sixth embodiment of the present invention. The configuration of the device according to the sixth embodiment enables a Bi- CMOS inverter circuit as shown in FIG. 10 to be attained. N-type diffusion regions 902 and 903 serving as collectors of NPN bipolar transistors BTr6 and BTr7 are formed in a P-type semiconductor substrate 901. Buried diffusion layers 904 and 905 are formed on the undersides of the diffusion regions 902 and 903, respectively. A P+-type separation region 906 is formed in the substrate 901 between the diffusion regions 902 and 903.

An insulating film 907 is formed on the N-type diffusion region 902, and a gate electrode 908 is formed on the insulating film 907. P+-type regions 909 and 910 serving as source and drain regions are formed on the diffusion region 902, thereby forming a P-channel MOS transistor MTr13. The N+-type region 910 is formed in the surface region of a P-type region 911 to serve as both the base of the transistor BTr6 and the drain of the transistor MTr13. The emitter of the transistor BTr6 corresponds to an N+-type region 912 formed in the P-type region 911, and a collector terminal is connected to an N+-type region 913 formed in the diffusion region 902.

A P-type region 914 is formed in the N-type diffusion region 903 to serve as a base diffusion region of the NPN bipolar transistor BTr7. An N-channel MOS transistor MTr14 is formed in the P-type region 914. An insulating film 917 is formed on the P-type region 914 so that it can be located between N+-type regions 915 and 916 serving as source and drain regions of the transistor MTr14, and a gate electrode 918 is formed on the insulating film 917. In the transistor BTr7, both a P+-type region 919 connected to a base terminal and an N+-type region 920 serving as an emitter are formed in the P-type region 914. An N+-type region 921 connected to a collector terminal is formed in the diffusion region 903. If wiring is performed using resistors R1 and R2 in the above configuration, an equivalent circuit as shown in FIG. 10 is formed.

In the configurations according to the above embodiments, when the potential of the back gate of the MOS transistor is the same as that of one pole of the bipolar transistor, a region is used in common to diffusion regions of these transistors, and another region is used in common to operating regions thereof in the circuit shown in FIG. 10. A contact process and a wiring process can thus be omitted and a circuit arrangement is simplified; accordingly, a chip area can be reduced.

According to the present invention, when a bipolar transistor/insulated gate transistor hybrid gate array is formed, wiring can easily be performed by efficiently and selectively using an insulated gate transistor and a bipolar transistor in accordance with the functions of a basic cell. This fact will be described.

Figure 11A:
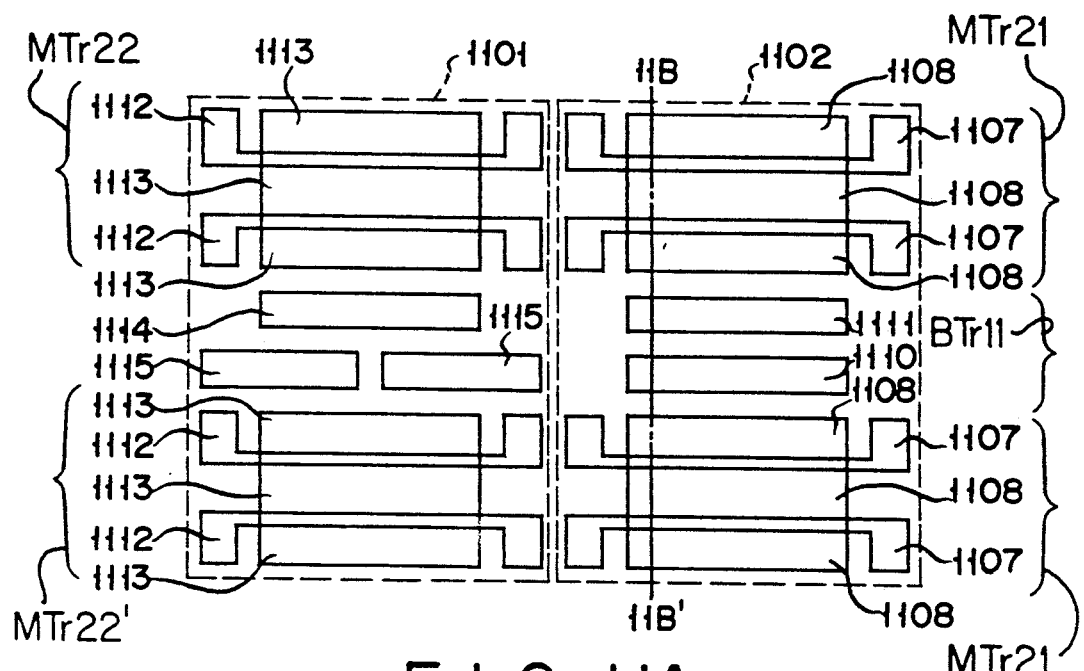
FIG. 11A is a plan view showing a pattern of a basic cell of a hybrid semiconductor device according to a seventh embodiment of the present invention which is applied to a Bi-CMOS gate array.
Figure 11B:
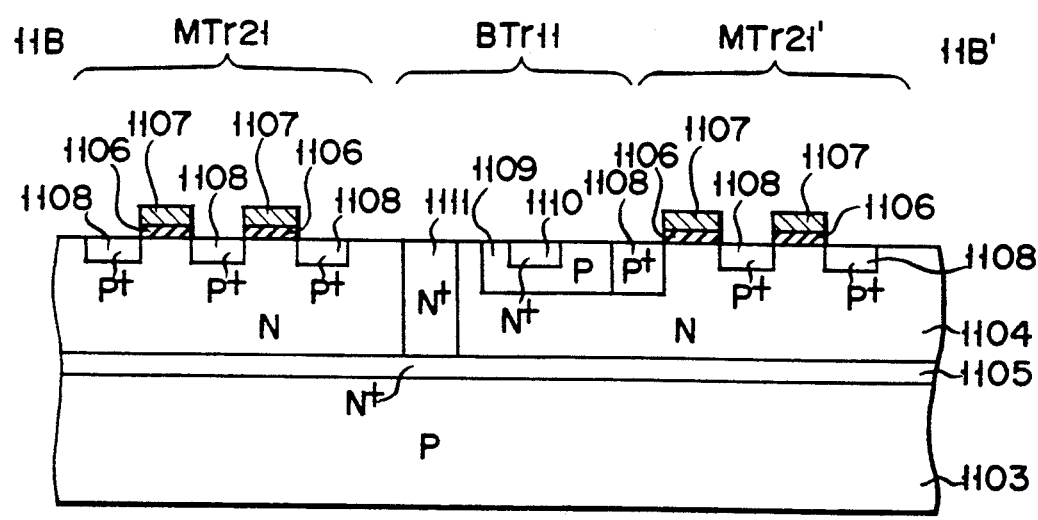
FIG. 11B is a cross-sectional view taken along line IIB–11B' of FIG. 11A.

FIG. 11A is a plan view showing a pattern of a basic cell of a hybrid semiconductor device according to a seventh embodiment of the present invention which is applied to a Bi-CMOS gate array, and FIG. 11B is a cross-sectional view taken along line 11B–11B' of FIG. 11A.

The basic cell includes a basic block 1101 of N-channel MOS transistors shown on the left side of FIG. 11A and a basic block 1102 of P-channel MOS transistors shown on the right side thereof.

In the basic block 1102, the P-channel MOS transistor includes a bipolar transistor. As shown in FIG. 11B, an N-type diffusion region 1104 is formed in a P-type semiconductor substrate 1103, and an N-type buried diffusion layer 1105 is formed on the underside of the N-type diffusion region 1104. Gate oxide films 1106 are formed on the N-type diffusion region 1104, and gate electrodes 1107 are formed on the gate oxide films 1106. P+-type regions 1108 serving as source and drain regions are formed in the surface region of the N-type diffusion region 1104 so that each of the gate electrodes 1107 is located between adjacent two of the regions 1108. The basic block 1102 thus includes P-channel MOS transistors MTr21 and MTr21' each having two gate electrodes 1107 and three P+-type regions 1108. The basic block 1102 further includes an NPN bipolar transistor BTr11 formed between the transistors MTr21 and MTr21'. In the transistor BTr11, a P-type region 1108 serving as a base contacts its nearest one of the P+-type regions 1108. The transistor BTr11 is so constructed that a region connected to a base terminal serves as the source and drain regions of the transistor MTr21'. An N+-type region 1110 is formed in the P-type region 1109 to serve as an emitter of the transistor BTr11. An N+-type region 1111 connected to a collector terminal, is formed in the N-type diffusion region 1104 near the P-type region 1109. The N-type diffusion region 1104 serves as both a collector of the transistor BTr11 and back gates of the transistors MTr21 and MTr21'.

The basic block 1101 also includes N-channel MOS transistors MTr22 and MTr22' each having two gate electrodes 1112 and three N+-type regions 1113. A P+-type region 1114 serving as a portion for taking out a back gate of the transistor MTr22 (22') and resistors 1115 formed of polysilicon or by impurity diffusion are formed on the surface of the substrate between the transistors MTr22 and MTr22'.

The basic block 1102 includes the NPN bipolar transistor BTr11, and a diffusion region of the base of the transistor BTr11 and a diffusion region of the transistor MTr21' are used in common. A separation region for separating the diffusion regions is not required and accordingly the transistors can be decreased in size.

Since the basic block 1101 of the N-channel MOS transistors includes no bipolar transistors, it can be made shorter than the basic block 1102 of the P-channel MOS transistors. In this embodiment, the basic block 1101 is set to have the same length as that of the basic block 1102 by arranging the resistors 1115.

Figure 12:
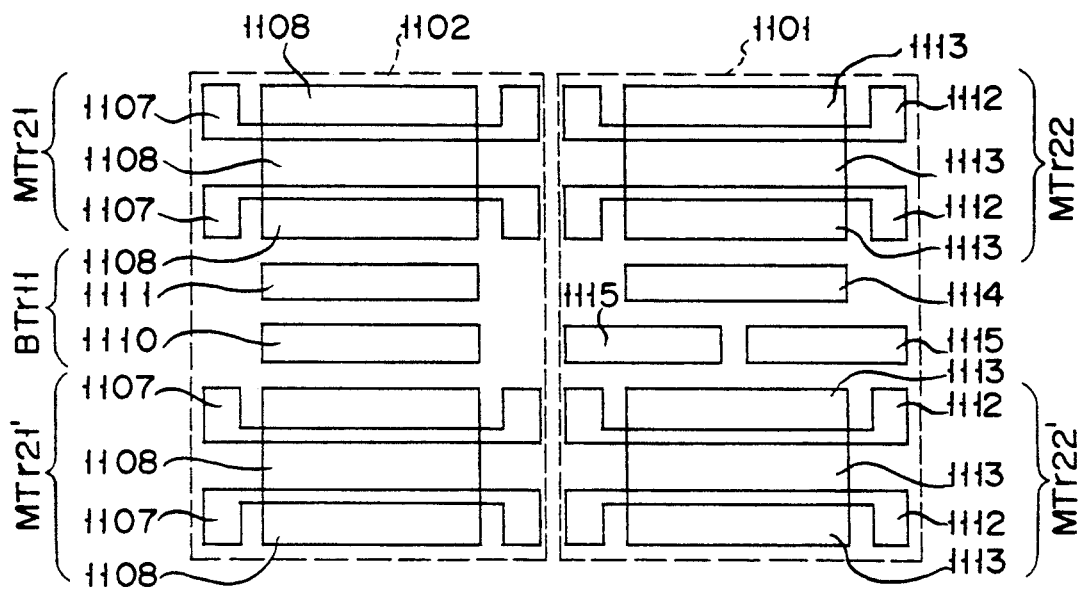
FIG. 12 is a plan view showing a pattern formed by reversing right and left portions of the pattern shown in FIG. 11A.

FIG. 12 shows a pattern of a basic cell obtained by reversing right and left portions of the pattern of the basic cell shown in FIG. 11A. In this pattern, the basic block 1102 of the P-channel MOS transistors is shown on the left side of FIG. 12 and the basic block 1101 of the N-channel MOS transistor is shown on the right side thereof.

Figure 13:
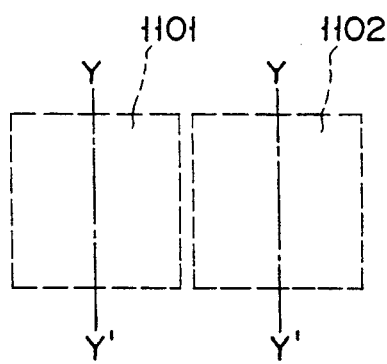
FIG. 13 is a view showing the symmetry of the patterns shown in FIGS. 11A and 12.

In the basic cell as shown in FIGS. 11A and 12, the basic blocks 1101 and 1102 are each symmetrical with respect to line Y–Y' as shown in FIG. 13. If a functional cell is designed based on the basic cell shown in FIG. 11A, it can be easily formed using data of mirror image and the basic cell shown in FIG. 12.

Figure 14:
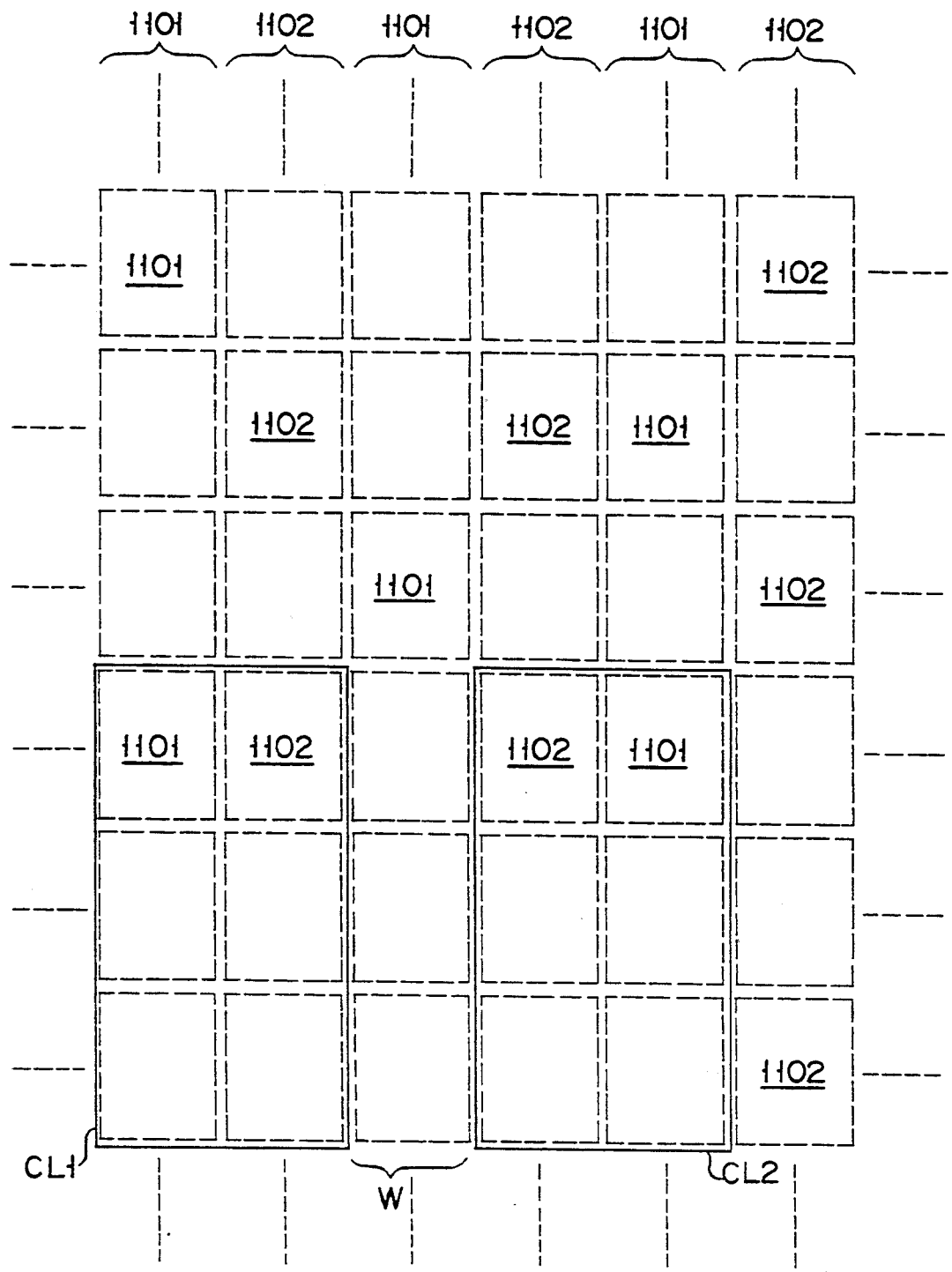
FIG. 14 is a view showing a configuration of a Bi-CMOS gate array to which the present invention is applied.

FIG. 14 shows a gate array in which the basic block 1101 of the N-channel MOS transistors and the basic block 1102 of the P-channel MOS transistors are alternately arranged. A functional cell CL1 is arranged using such a basic cell as shown in FIG. 11A. The N-channel MOS transistors (basic blocks 1101) on the right side of the functional cell CL1 is not a basic cell but a wiring region W. Using a basic cell such as shown in FIG. 12, a functional cell CL2 is arranged using a basic cell such as shown in FIG. 12 on the right side of the wiring region W.

If the gate array is constituted of the functional cell CL1 and the functional cell CL2 of a mirror image of the cell CL1, the width of the wiring region W can be set narrower than that of the basic cell. For example, if the width of the basic cell is twelve grids, wiring regions are arranged only every twelve grids in the prior art gate array, but the regions can be arranged every six grids in the present invention. More specifically, the area of the wiring regions is set to a minimum essential in accordance with the types of circuits and the number of wiring layers formed on the master slice to arrange the functional cells. The area and position of the wiring region can be set more freely, and the MOS transistor and bipolar transistor can be used efficiently and selectively. As a result, the efficiency of use for the gate array (master slice) is improved and the circuit can be reduced in size.

Figure 15:
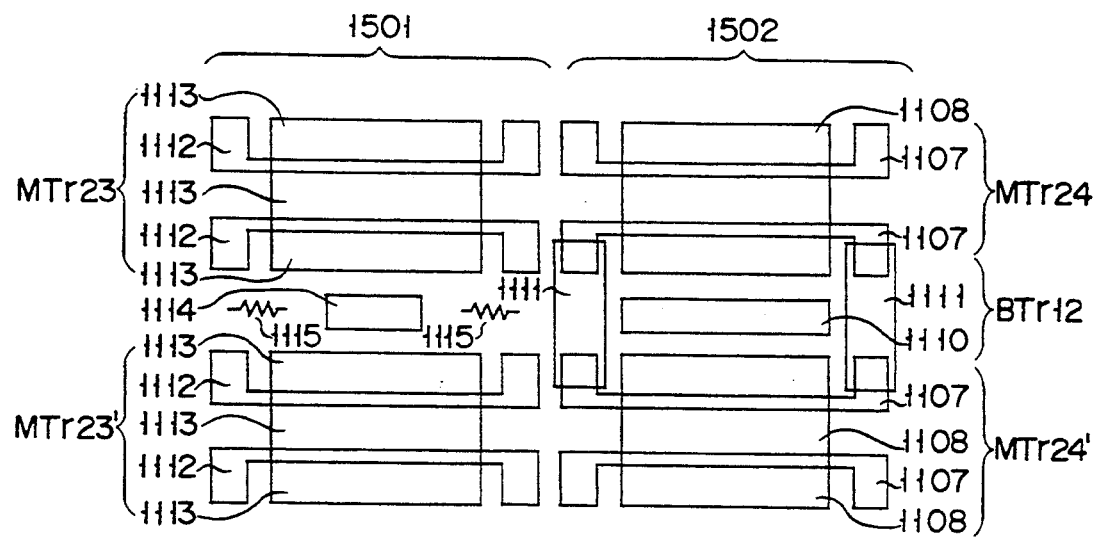
FIG. 15 is a plan view showing a pattern of a basic cell of a hybrid semiconductor device according to an eighth embodiment of the present invention which is applied to the Bi-CMOS gate array.

FIG. 15 is a plan view showing a pattern of a basic cell of a hybrid semiconductor device according to an eighth embodiment of the present invention which is applied to a Bi-CMOS gate array.

The basic cell includes a basic block 1501 in which N-channel MOS transistors MTr23 and MTr23' are arranged and a basic block 1502 in which P-channel MOS transistors MTr24 and MTr24' are arranged. In FIG. 15, the same elements as those in FIG. 11A are denoted by the same reference numerals. In the seventh embodiment shown in FIG. 11B, the emitter, collector, and base of bipolar transistor BTr11 are aligned. In a bipolar transistor BTr12 shown in FIG. 15, N+-type regions 1111 connected to a collector terminal are arranged next to both ends of an N+-type region 1110 serving as an emitter. Therefore, the length of the basic block 1502 is made shorter than that of the basic block 1102 shown in FIG. 11A and accordingly the length of the basic block 1501 is set to be equal to that of the basic block 1502 by properly arranging resistors 1115.

Figure 16:
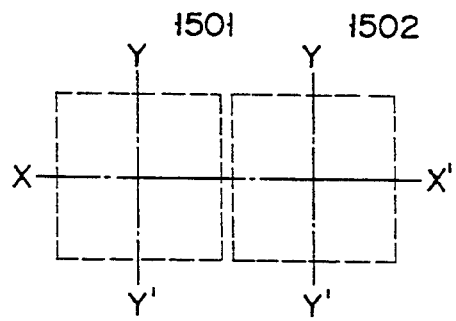
FIG. 16 is a view showing the symmetry of the pattern shown in FIG. 15.

In the above arrangement shown in FIG. 15, the basic blocks 1501 and 1502 are each symmetrical with respect to a line Y-Y' or a line X-X', as shown in FIG. 16. When a functional cell is designed on the basis of the basic cell shown in FIG. 15, not only a wiring region can be set for each unit of the transistors as shown in FIG. 14, but also the functional cell can be arranged on both right and left sides, and a mirror image or an original image can be selected in accordance with its efficiency.

Figure 17A:
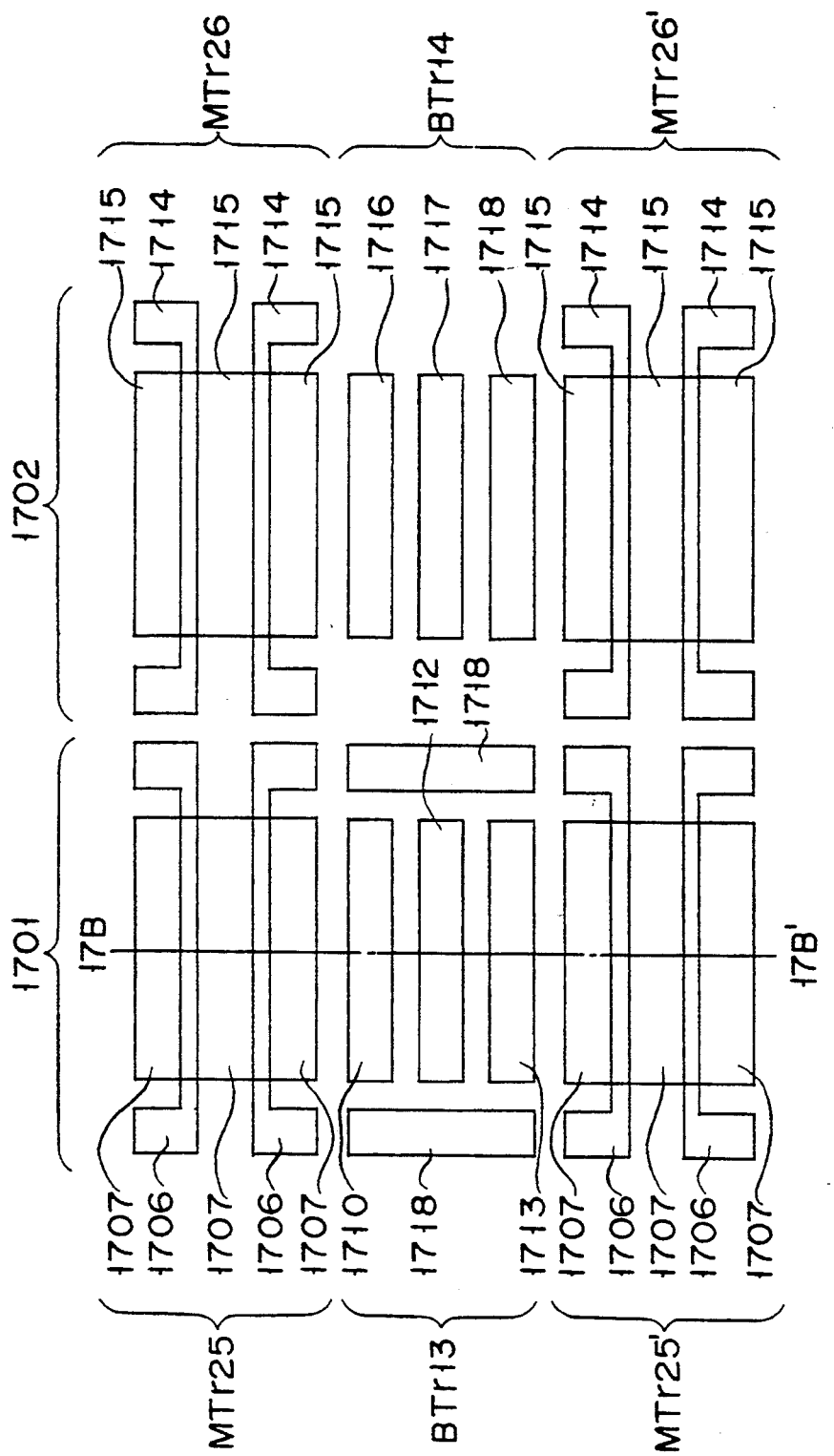
FIG. 17A is a plan view showing a pattern of a basic cell a hybrid semiconductor device according to a ninth embodiment of the present invention which is applied to the Bi-CMOS gate array.
Figure 17B:
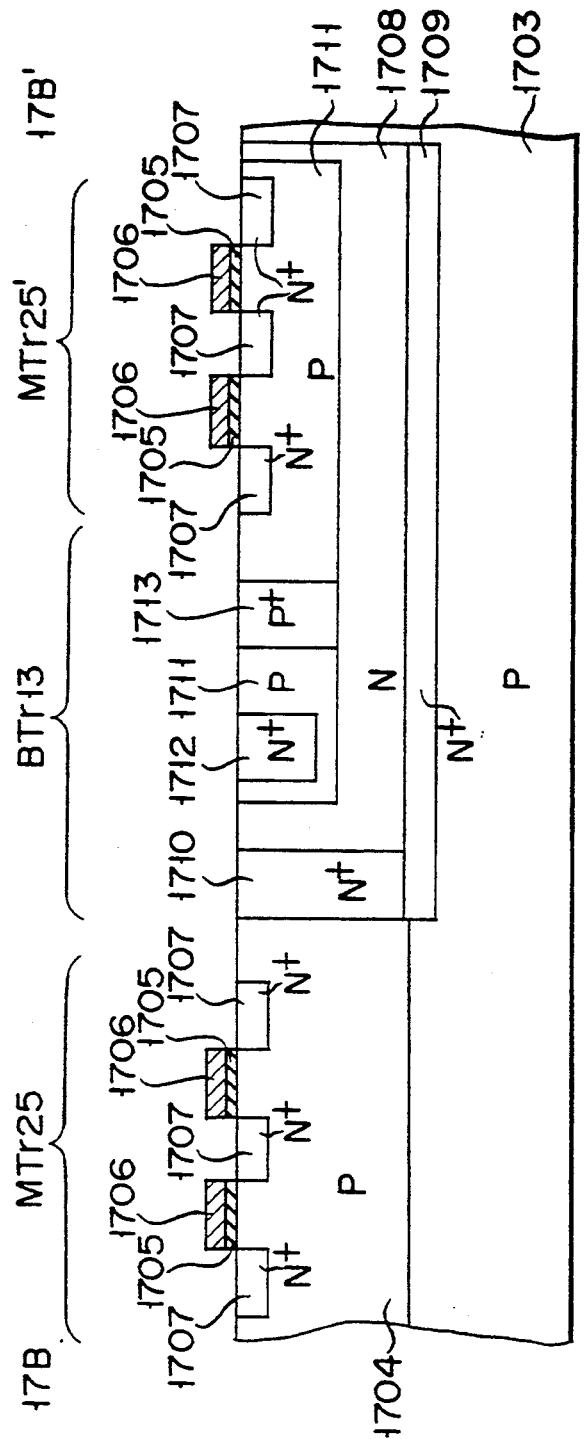
FIG. 17B is a cross-sectional view taken along line 17B–17B' of 17A.

FIG. 17A is a plan view showing a pattern of a basic cell of a hybrid semiconductor device according to a ninth embodiment of the present invention which is applied to the Bi-CMOS gate array, and FIG. 17B is a cross-sectional view taken along line 17B-17B' of FIG. 17A.

The basic cell includes a basic block 1701 of N-channel MOS transistors and a basic block 1702 of P-channel MOS transistors. In each of the basic blocks 1701 and 1702, an NPN bipolar transistor is formed between the MOS transistors.

The basic block 1701 will be described with reference to FIG. 17B. Two gate insulating films 1705 are formed on a P-type diffusion region 1704 in a P-type semiconductor substrate 1703, and gate electrodes 1706 are formed on their corresponding gate insulating films 1705. N+-type regions 1707 serving as source and drain regions are formed in the surface portion of the P-type diffusion region 1704 so that each of the regions 1707 can be located between adjacent two of the gate electrodes 1706.

An N-type diffusion region 1708 formed in the P-type semiconductor substrate 1703 is a collector of an NPN bipolar transistor BTr13, and an N+-type buried diffusion layer 1709 is formed on the underside of the N-type diffusion region 1708. An N+-type region 1710 to which a collector terminal is connected, is formed at an end portion of the N-type diffusion region 1708. A P-type diffusion region 1711 is formed in the N-type diffusion region 1708 to serve as an base of the transistor BTr13. An N+-type diffusion region 1712 connected to an emitter terminal of the transistor BTr13 and a P+-type diffusion region 1713 serving as a base of the transistor BTr13 are formed in the diffusion region 1711.

Two gate insulating films 1705 are formed on a P-type diffusion region 1711 and gate electrodes 1706 are formed on their corresponding gate insulating films. N+-type regions 1707 serving as source and drain regions are formed in the surface portion of the P-type diffusion region 1711 so that each of the N+-type regions 1707 can be located between adjacent two of the gate electrodes 1706.

The basic block 1701 thus comprises N-channel MOS transistors MTr25 and MTr25' each having two gate electrodes 1706 and three N+-type regions 1707, and bipolar transistor BTr13 formed between the transistors MTr25 and MTr25'.

The basic block 1702 comprises P-channel MOS transistors MTr26 and MTr26' each having two gate electrodes 1714 and three P+-type regions 1715, and a BTr14 formed between the transistors MTr26 and MTr26'. The basic block 1702 has the same configuration as that of the basic block shown in FIG. 11B. An N+-type region 1716 connected to a collector terminal of the bipolar transistor BTr14 and an N+-type region 1717 connected to an emitter terminal are formed in an N-type region between the transistors MTr26 and MTr26'. Resistors 1718 are arranged to make the length of the basic block 1701 equal to that of the basic block 1702. The base of the transistor BTr14 and one of the P+-type regions 1715 of the transistor MTr26 are used in common, and the back gates of the transistors MTr26 and MTr26' and the collector of the transistor BTr14 are also used in common. The resistors 1718 are arranged at both ends of the basic block 1701.

In the above configuration, as shown in FIG. 17B, the N-channel MOS transistor MTr25' is formed in the P-type diffusion region 1711 serving as a base of the bipolar transistor BTr13. If, therefore, the transistor MTr25 is used, the source and back gate are at the same potential, and no substrate modulation occurs.

As described above, according to the present invention, the same diffusion region is used as both one pole of the bipolar transistor and the back gate of the insulated gate transistor, so that the circuit can be reduced in size. In the gate array, since the bipolar transistor is incorporated into the insulated gate transistors, the basic cell can be reduced in area. In the gate array, therefore, both the wiring region and functional cell can be reduced and the efficiency of use for the transistors is improved. A bipolar transistor/insulated gate transistor hybrid semiconductor device can be obtained with high degree of integration.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A bipolar transistor/insulated gate transistor hybrid semiconductor device, comprising:
   a first well region formed in a semiconductor substrate to serve as a first active region of a first bipolar transistor;
   a first insulated gate transistor of a first conductivity type having source and drain regions formed in said first well region, said first well region acting as a back gate of said insulated gate transistor;
   second and third active regions of said first bipolar transistor formed in said well region;
   a second well region formed in said semiconductor substrate to serve as a fourth active region of a second bipolar transistor;
   a fifth active region of said second bipolar transistor formed in said second well region;
   a first insulated gate transistor of a second conductivity type having source and drain regions in said fifth active region, said fifth active region acting as a back gate of said insulated gate transistor of the second conductivity type;
   a sixth active region of said second bipolar transistor formed in said fifth active region;
   a third well region of a conductivity type different from that of said first and second well regions formed in said semiconductor substrate;
   a second insulated gate transistor of the second conductivity type having source and drain regions formed in said third well region, said third well region acting as a back gate of said second insulated gate transistor of the second conductivity type;
   a first array including a plurality of first well regions corresponding to said first well region and arranged in a first direction; and
   a second array including a plurality of second and third well regions corresponding to said second well region and third well region alternately arranged in a second direction which is the same as the first direction.

2. The device according to claim 1, wherein at least one of the second and third active regions of said first bipolar transistor is used in common to one of the source region, and the drain region of said insulated gate transistor of the first conductivity type, and at least one of the fifth and sixth active regions of said second bipolar transistor is used in common to one of the source region, the drain region and the back gate of said first insulated gate transistor of the second conductivity type.

3. The device according to claim 1, wherein said first and second arrays are alternately arranged on said semiconductor substrate to constitute a gate array.

4. The device according to claim 1, wherein one of said plurality of first well regions arranged in said first array corresponds to a first basic block, and one of said plurality of second well regions and one of said plurality of third well regions arranged in said second array correspond to a second basic block, said first and second basic blocks having a same length in the first and second directions.

5. The device according to claim 4, wherein said first basic block includes first and second elements, said first element including said first insulated gate transistor of the first conductivity type and said second element including a second insulated gate transistor of the first conductivity type, one of said first and second elements having a plurality of gate electrodes and a plurality of active regions, each of said gate electrodes being interposed between adjacent two of said active regions, and said first bipolar transistor being arranged between said first and second elements.

6. The device according to claim 5, wherein a resistive element is formed between said two elements of said first basic block.

7. The device according to claim 4, wherein said second basic block includes first and second elements, said first element including said first insulated gate transistor of the second conductivity type and said second element including said second insulated gate transistor of the second conductivity type, each of said first and second elements having a plurality of gate electrodes and a plurality of active regions, each of said gate electrodes being interposed between adjacent two of said active regions, and said second bipolar transistor being formed between said first and second elements.

8. The device according to claim 7, wherein a resistive element is formed between said two elements of said second basic block.

9. The device according to claim 4, wherein said first and second basic blocks each have a pattern whose symmetry axis corresponds to the first and second directions of said first and second arrays.

10. The device according to claim 4, wherein said first and second basic blocks each have a pattern whose first symmetry axis corresponds to the first and second directions of said first and second arrays and whose second symmetry axis is located both between said first basic blocks and between said second basic blocks, and perpendicular to said first symmetry axis.

11. A bipolar transistor/insulated gate transistor hybrid semiconductor device, comprising:
    a well region formed in a semiconductor substrate to serve as a first active region of a bipolar transistor;
    second and third active regions of said bipolar transistor, formed in said well region;
    a first array including a plurality of first regions, each of said first regions corresponding to said well region and arranged in a particular direction, one of said plurality of first regions arranged in said first array having a structure corresponding to a first basic block having a length in said particular direction; and
    a second array including a plurality of second regions formed in said semiconductor substrate and arranged in said particular direction, a predetermined number of said second regions arranged in said second array each having a structure corresponding to a second basic block having a length in said particular direction equal to said length of said first basic block;
    said first basic block including two elements, each element including an insulated gate transistor of a first conductivity type having source and drain regions formed in said well region, said well region acting as a back gate of each insulated gate transistor, one of said elements having a plurality of gate electrodes and a plurality of active regions, said plurality of active regions being greater in number than said plurality of gate electrodes by one, each of said plurality of gate electrodes being interposed between two adjacent ones of said plurality of active regions, and said bipolar transistor being arranged between said two elements of said first basic block; and said second basic block including two elements, each element including an insulated gate transistor of a second conductivity type having source and drain regions formed in said semiconductor substrate and being formed next to said well region, one of said elements having a plurality of gate electrodes and a plurality of active regions, said plurality of active regions being greater in number than said plurality of gate electrodes by one, each of said gate electrodes being interposed between two adjacent ones of said plurality of active regions, and a resistive element being formed between said two elements of said second basic block.

12. The device according to claim 11, wherein said first and second basic blocks each have a pattern whose symmetry axis corresponds to said particular directions of said first and second arrays.

13. The device according to claim 11, wherein said first and second basic blocks each have a pattern whose first symmetry axis corresponds to said particular directions of said first and second arrays and whose second symmetry axis is perpendicular to said first symmetry axis.

* * * * *